US012701973B2

(12) United States Patent
Fournel et al.

(10) Patent No.: US 12,701,973 B2
(45) Date of Patent: Aug. 4, 2026

(54) STRONG BASE-ASSISTED DIRECT BONDING METHOD

(71) Applicant: COMMISSARIAT A L'ENERGIE ATOMIQUE ET AUX ENERGIES ALTERNATIVES, Paris (FR)

(72) Inventors: Frank Fournel, Grenoble (FR); Aziliz Calvez, Grenoble (FR); Vincent Larrey, Grenoble (FR); Christophe Morales, Grenoble (FR)

(73) Assignee: COMMISSARIAT A L'ENERGIE ATOMIQUE ET AUX ENERGIES ALTERNATIVES, Grenoble (FR)

( * ) Notice: Subject to any disclaimer, the term of this patent is extended or adjusted under 35 U.S.C. 154(b) by 540 days.

(21) Appl. No.: 18/196,184

(22) Filed: May 11, 2023

(65) Prior Publication Data

US 2023/0386894 A1 Nov. 30, 2023

(30) Foreign Application Priority Data

May 25, 2022 (FR) ...................................... 22/05048

(51) Int. Cl.
H10P 90/00 (2026.01)
B32B 7/12 (2006.01)
(Continued)

(52) U.S. Cl.
CPC ............ H10P 90/1914 (2026.01); B32B 7/12 (2013.01); B32B 18/00 (2013.01);
(Continued)

(58) Field of Classification Search
None
See application file for complete search history.

(56) References Cited

U.S. PATENT DOCUMENTS

2006/0141746 A1 6/2006 Delattre et al.
2006/0273068 A1 12/2006 Maunand Tussot et al.
(Continued)

FOREIGN PATENT DOCUMENTS

FR 2 880 186 A1 6/2006
FR 3102771 A1 5/2021
(Continued)

OTHER PUBLICATIONS

U.S. Appl. No. 18/198,390, filed May 17, 2023 in the name of Fournel et al.
(Continued)

*Primary Examiner* — Jeffrey D Washville
(74) *Attorney, Agent, or Firm* — Oliff PLC

(57) ABSTRACT

A direct bonding method between two substrates includes the steps of: providing a first substrate and a second substrate respectively including a first hydrophilic bonding surface and a second hydrophilic bonding surface; depositing on the first and/or on the second hydrophilic bonding surface a basic solution consisting of strong base molecules and deionized water; drying the first and/or the second hydrophilic bonding surface until a concentration with between approximately $10^9$ atom/cm$^2$ and $10^{15}$ atom/cm$^2$ of cations resulting from the strong base molecules on the first and/or on the second hydrophilic bonding surface; contacting the first and the second hydrophilic bonding surface so as to obtain a spontaneous direct bonding and an assembly of the first substrate with the second substrate including a direct bonding interface.

10 Claims, 2 Drawing Sheets

(51) Int. Cl.
    *B32B 18/00*     (2006.01)
    *B32B 37/12*     (2006.01)
    *H10W 10/10*     (2026.01)

(52) U.S. Cl.
    CPC ....... *B32B 37/1284* (2013.01); *H10W 10/181* (2026.01); *B32B 2037/1276* (2013.01); *B32B 2255/20* (2013.01); *B32B 2309/02* (2013.01)

(56) References Cited

U.S. PATENT DOCUMENTS

| | | |
|---|---|---|
| 2018/0095067 A1 | 4/2018 | Huff et al. |
| 2018/0297341 A1 | 10/2018 | Ueki et al. |
| 2019/0214259 A1 | 7/2019 | Fournel et al. |
| 2020/0075360 A1 | 3/2020 | Kim et al. |
| 2020/0392040 A1 | 12/2020 | Acquard et al. |
| 2021/0057263 A1 | 2/2021 | Kim et al. |
| 2023/0386891 A1 | 11/2023 | Fournel et al. |
| 2024/0190105 A1 | 6/2024 | Namikawa et al. |

FOREIGN PATENT DOCUMENTS

| | | |
|---|---|---|
| JP | 6286078 B2 | 2/2018 |
| JP | WO202/0032284 A1 | 8/2021 |
| WO | 2017/160961 A1 | 9/2017 |
| WO | 2019/202067 A1 | 10/2019 |
| WO | 2021/084188 A1 | 5/2021 |

OTHER PUBLICATIONS

U.S. Appl. No. 18/316,338, filed May 12, 2023 in the name of Fournel et al.
Sep. 19, 2025 Office Action issued in U.S. Appl. No. 18/198,390.
Sep. 23, 2025 Notice of Allowance issued in U.S. Appl. No. 18/316,338.
Jan. 8, 2026 Office Action issued in U.S. Appl. No. 18/198,390.

[Fig. 1]
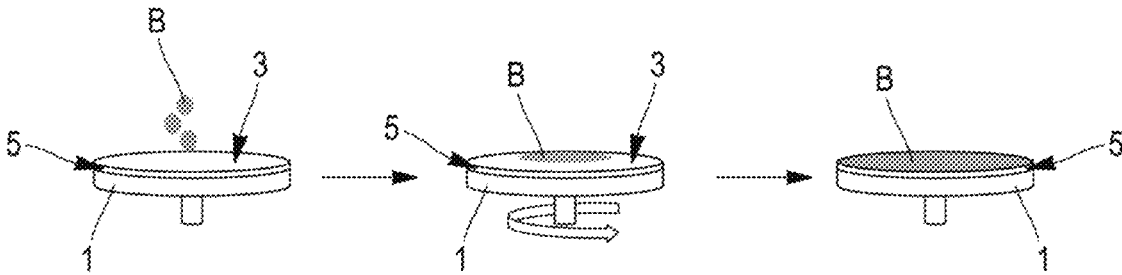
[Fig. 2]
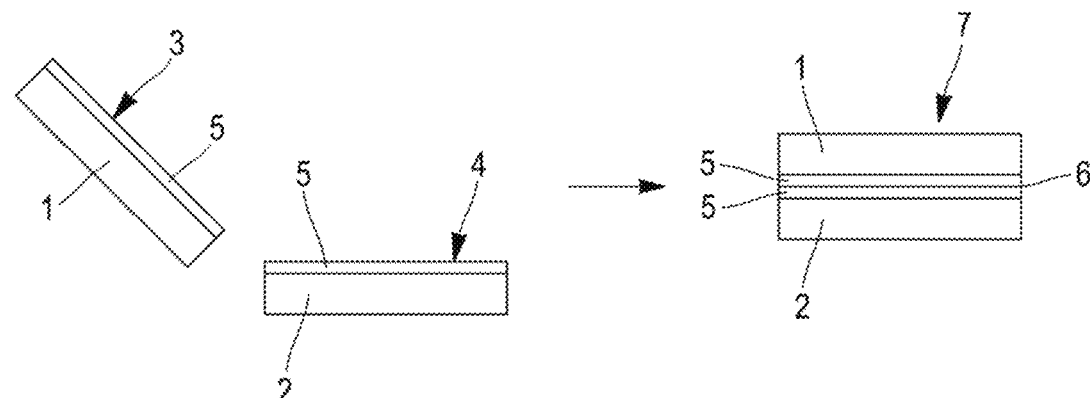
[Fig. 3]
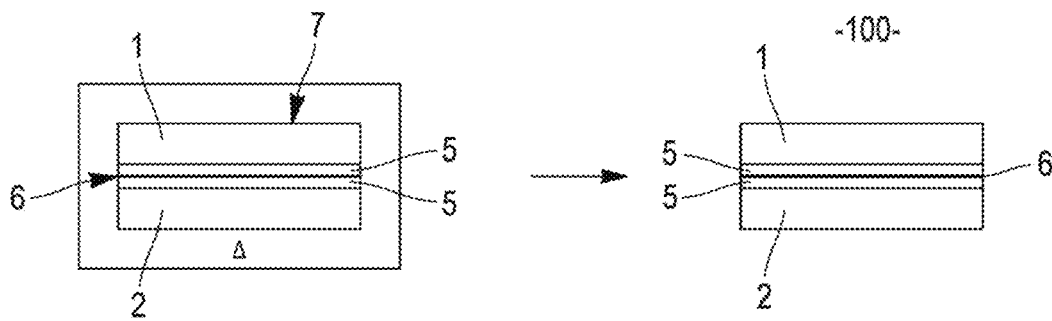

[Fig. 4]
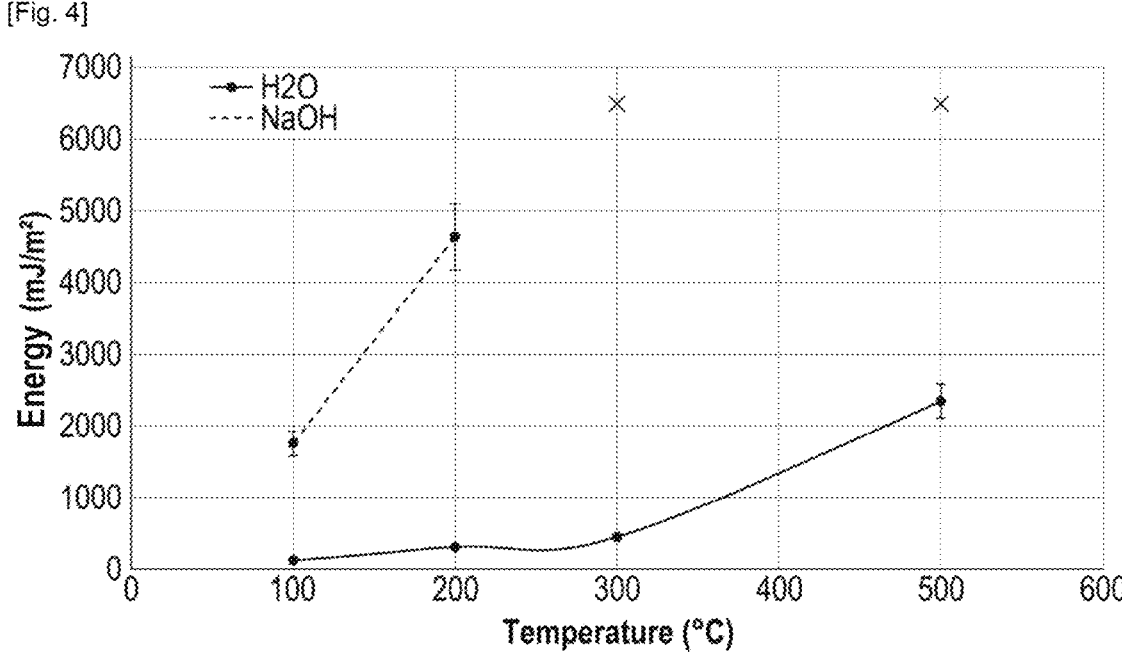
[Fig. 5]
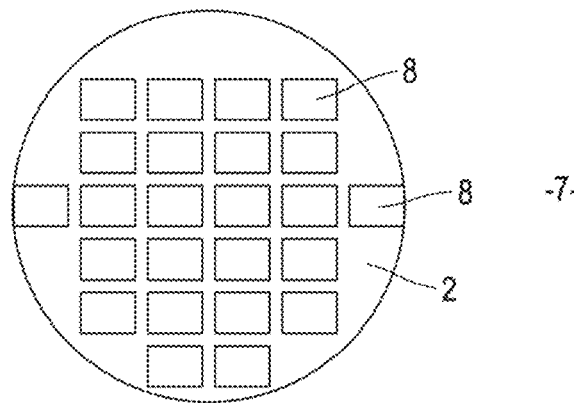

STRONG BASE-ASSISTED DIRECT BONDING METHOD

The present invention relates to the field of direct bonding. It concerns in particular a direct bonding method between two substrates. According to a second aspect, the invention concerns an assembly that can be obtained with such a method.

The direct bonding is a technique well known now and used for industrial applications such as the manufacture of SOI by the company SOITEC or the company STMicroelectronics for the production of imagers for example. As understood in this document, direct bonding is spontaneous bonding between two surfaces without adding a layer of material to the interface between the bonded surfaces, and in particular without a thick layer of liquid, that is to say without a layer with a thickness greater than 100 nm. It is nevertheless possible to have some monolayers of water adsorbed on the surfaces, which represents between 0.25 nm and 1.25 nm in thickness, so that these surfaces are macroscopically dry.

An important characteristic of direct bonding is its adhesion energy, that is to say the energy available to achieve spontaneous bonding. This is the energy that allows the two surfaces to be deformed to bring them into contact at the atomic scale so that the Van der Waals forces can be implemented. For example, for two surfaces of silicon or hydrophilic silicon oxide, the adhesion energy typically ranges from 30 to 100 mJ/m². This adhesion energy partly directs the duration of the propagation of the bonding wave, for example the bonding wave propagates in a conventional way in 9 seconds for the direct bonding of two 200 mm silicon substrates.

Another important characteristic of direct bonding is its adherence energy or otherwise called its bonding energy. This is the energy that must be used to separate the two bonded surfaces. In the context of the bonding of two silicon substrates covered with thermal oxide about 145 nm thick, this adherence varies between 0.14 J/m² and 6 J/m² typically.

To obtain spontaneous bonding and manufacture stable multilayer structures over time, the surfaces are generally cleaned of organic and particulate contaminations which are very detrimental to direct bonding. For example, cleaning is carried out beforehand on the surfaces to be bonded with a Caro acid-based solution obtained with a mixture of 96% sulfuric acid and 30% hydrogen peroxide (3:1) at 180° C. and SC1 (mixture of 30% ammonia, 30% hydrogen peroxide and deionized water (1:1:5)) at 70° C. Alternatively, it is possible to use other highly oxidizing cleaning solutions such as, for example, aqueous solutions containing ozone or else with a treatment using exposure to UV light in the presence of gaseous ozone. The adherence energy of a $SiO_2$—$SiO_2$ bonding (two silicon substrates coated with approximately 145 nm of thermal oxide for example), in a clean room atmosphere, with chemical cleaning based on Caro and SC1 at 70° C., is about 140 mJ/m² just after bonding, without heat treatment.

The bonding energy also evolves according to the heat treatment that is applied after the bonding carried out at room temperature. The adherence energy increases as a function of the temperature of the heat treatments. For example, the $SiO_2$—$SiO_2$ bonding energy rises slowly to reach, depending on the surface treatment, 3 J/m² at 500° C. and then stagnates up to 800° C.

To further increase the bonding energy, another solution consists in carrying out a plasma treatment prior to the contacting. With a nitrogen ($N_2$) plasma, for oxide-oxide bonding, the bonding energy rises rapidly to approximately 5 J/m² for a treatment temperature of 300° C.

However, the use of a plasma may be incompatible with certain substrates and/or its use lengthens the times and/or costs of the methods, which makes them more difficult to industrialize. The plasma treatment also modifies the surface over a thickness of a few nanometers (between 1 and 10 nm). This change may affect future devices. For example, with a silicon plate, the plasma creates an oxide layer which is difficult to be controlled in terms of thickness and quality. With a silicon oxide surface, certain plasmas such as the $N_2$ plasma create interfacial charge problems that can disrupt the electrical operation of future devices.

It is also possible, as described in the document FR1912269, to add a small quantity of a molecule having an alcohol function and a basic function such as an amino alcohol, on the hydrophilic surfaces before bonding them, which increases the direct bonding energy, without the need for plasma treatment.

One of the aims of the present invention is to remedy the drawbacks of the prior art. To this end, the present invention proposes a direct bonding method between two substrates, the method comprising the steps of:

a) providing a first substrate and a second substrate respectively comprising a first hydrophilic bonding surface and a second hydrophilic bonding surface, b) depositing on the first and/or on the second hydrophilic bonding surface a basic solution consisting of strong base molecules and deionized water, c) drying the first and/or of the second hydrophilic bonding surface so as to reach a concentration comprised between about $10^9$ atoms/cm² and $10^{15}$ atoms/cm² of cations resulting from the strong base molecules on the first and/or on the second hydrophilic bonding surface, d) contacting the first and the second hydrophilic bonding surface so as to obtain a spontaneous direct bonding and an assembly of the first substrate and of the second substrate comprising a direct bonding interface.

Thus achieved, the direct bonding method is a spontaneous and immediate direct bonding. Indeed, the very low concentration of basic molecules on the hydrophilic bonding surfaces does not modify the adhesion energy making it possible to deform the surfaces to bring them into contact at the atomic scale. It requires a lower bonding annealing temperature to achieve the same bonding energy as in the absence of a molecule. It is not necessary to do plasma treatment. A plasma treatment is still possible and does not reduce the bonding energy obtained for a given annealing temperature. The assembly thus obtained is resistant and can be immediately handled by conventional microelectronics tools without requiring the first substrate to be kept in contact with the second substrate in a specific manner, nor to apply any pressure, nor even to placing the assembly in a particular bonding energy enhancing environment. Moreover, steps b) of depositing the basic solution and the drying of step c) do not lengthen the cycle time significantly. These are simple steps to implement and inexpensive. Strong base molecules used in very small quantities are inexpensive.

In this document, the expression «strong base» means a base whose pKa is greater than or equal to 14 in water. The strong base completely dissociates in $H_2O$ to give $OH^-$ ions and cations in solution.

The term «hydrophilic surface» means that at least one monolayer of water is adsorbed on its surface at ambient pressure (i.e. in the range of 1 bar) in air having at least 1% relative humidity. A surface is said to be hydrophilic if the angle of a drop of water is less than 90° and preferably less than 50°, and even more preferably less than 5°.

According to a possibility, step c) of drying is carried out so that the first hydrophilic bonding surface and the second hydrophilic bonding surface are covered with one to five atomic monolayers of $H_2O$ (thickness of 0.25 to 1.25 nm). These surfaces are thus dry on a macroscopic scale, any atomic monolayers of residual water on the surface are conventionally obtained after drying of the hydrophilic surfaces.

According to an arrangement, said strong base molecules consist of inorganic molecules, in particular alkali metal hydroxides, alkaline earth metal hydroxides or a mixture of these molecules.

According to a possibility, the strong base molecules are selected from the bases LiOH, NaOH, KOH, RbOH, CsOH, $Mg(OH)_2$, $Ca(OH)_2$, $Sr(OH)_2$, $Ba(OH)_2$ and a mixture of these bases.

According to a particular embodiment, the basic solution is deposited by spin coating on the first and/or the second hydrophilic bonding surface. This spin coating makes it possible to spread the basic solution in a homogeneous manner thanks to an adjustable speed of rotation of the plate, for example between 0 and 500 revolutions/min. This method guarantees that the entire considered surface is well covered.

Concretely, the basic solution has a concentration of strong base molecules comprised between $10^{-8}$ mol/l and $10^{-2}$ mol/l in deionized water.

Advantageously, step c) is carried out by centrifugation, for example with a speed of rotation of approximately 2000 revolutions/min, of the first and/or of the second hydrophilic bonding surface (3, 4), in particular for 45 sec. The centrifugation is carried out in particular after the spin coating in step b) so as to use the same equipment and avoid moving the first and second substrates.

According to another arrangement, step b) is carried out by soaking the first and/or the second hydrophilic bonding surface in the basic solution.

According to another variant, step c) is carried out by Marangoni drying.

According to a possibility, the method further comprises a step e) of applying a heat treatment to the assembly obtained in step d) at a temperature comprised between 50° C. and 500° C., in particular between 50 and 350° C. and in particular between 60 and 250° C. This bonding annealing heat treatment makes it possible to further reinforce the bonding energy while remaining at low temperatures, that is to say less than or equal to 500° C.

It is however possible to go up to much higher temperatures such as for example 900° C., 1100° C. or 1200° C. if necessary, for example for a constraint other than that of reaching a high bonding energy, without no particular defect is observed.

According to a particular embodiment, the first and second substrates are made of silicon.

According to a possibility, the first hydrophilic bonding surface and/or the second hydrophilic bonding surface are formed at least in part by a hydrophilic film in a material selected among silicon oxide, silicon nitride, copper oxide and a mixture of these materials.

The hydrophilic silicon oxide film is selected from a thermal oxide, a deposited oxide, and a native oxide.

According to a variant, the first substrate provided in step a) comprises one or more first vignettes originating from the vignetting of the first substrate so as to obtain a direct bonding of one or more first vignettes to the second substrate.

The first hydrophilic bonding surface is delimited by the exposed face of one or more first vignettes.

According to another variant, the second substrate provided in step a) comprises one or more second vignettes originating from the vignetting of the second substrate so as to obtain direct bonding between one or more first vignettes and one or more second vignettes.

The second hydrophilic bonding surface is delimited by the exposed face of one or more second vignettes.

The present invention thus makes it possible to proceed with the direct bonding of one or more first vignettes with a surface of 1 mm×1 mm on a second substrate of 300 mm for example, such as proceeding with the direct bonding of one or more first vignettes and one or more second vignettes each having an area of approximately 1 mm×1 mm.

According to a second aspect, the invention proposes an assembly comprising a first substrate and a second silicon substrate respectively comprising a first hydrophilic bonding surface and/or a second hydrophilic bonding surface, the first and the second hydrophilic bonding surface being bonded by direct bonding, strong base molecules being arranged with a concentration comprised between approximately $10^9$ atoms/$cm^2$ and $10^{15}$ atoms/$cm^2$ and in particular between approximately $10^{10}$ atoms/$cm^2$ and $10^{14}$ atoms/$cm^2$ at the direct bonding interface between the first and the second hydrophilic bonding surface.

These concentrations are measured by mass spectrometry such as by ICPMS (Inductively Coupled Plasma mass Spectroscopy) or by TXRF (Total X Ray Fluorescence spectroscopy).

It is understood that this assembly has the bonding energy required not to lead to the separation of the substrates after they have been brought into contact.

The first substrate and the second substrate are each formed by a material selected from LTO, LNO, diamond, alumina, and semiconductor materials, in particular silicon, germanium, silicon oxides, oxides of germanium, silicon nitrides, SiOC, SiC, InP, GaAs, GaN, and a combination of these materials.

The first and/or the second substrate are covered by a layer of silicon oxide, silicon nitride, copper oxide or a mixture of these compounds.

According to an exemplary embodiment, the first substrate and the second substrate provided in step a) are silicon substrates having a diameter comprised between 100 mm and 300 mm, in particular 200 mm, and in which the first hydrophilic bonding surface and the second hydrophilic bonding surface are each formed by a hydrophilic film of silicon oxide.

According to other characteristics, the direct bonding method of the invention includes one or more of the following optional characteristics considered alone or in combination:

The first and the second bonding surface provided in step a) are prepared by a CARO, SC1, treatment with ozonated water so as to clean the particulate and organic contamination and make the surfaces hydrophilic.

The first bonding surface and the second bonding surface are brought into contact in step d) at room temperature.

The deposition according to step b) of a basic solution comprises beforehand the formation of a basic preparation obtained by mixing strong base molecules in deionized water.

According to an arrangement, the basic solution comprises a mass concentration comprised between $10^{-8}$ and $10^{-4}$ g·cm$^{-3}$ of NaOH in deionized water, in particular a mass concentration of approximately $10^{-5}$ g·cm$^{-3}$.

The bonding annealing heat treatment according to step e) is carried out over a period of approximately 2 hours.

The contacting according to step c) of the method is carried out under atmospheric pressure or under vacuum.

The heat treatment according to step d) of the method is carried out under atmospheric pressure.

The direct bonding method is devoid of any application of external pressure on the first and/or second substrates in step d) or after step d).

The first and/or the second hydrophilic bonding surface has, before step d) a quantity of strong base molecules less than the quantity necessary to form an atomic monolayer or the quantity necessary to saturate all of the sites of grip of the first and/or the second hydrophilic bonding surface.

The first and/or the second hydrophilic bonding surface are completely formed by a continuous hydrophilic film in a material selected from silicon oxide, silicon nitride, copper oxide or a mixture of these materials.

The first and/or the second hydrophilic bonding surface has a roughness of less than 0.5 nm RMS (Root Mean Square).

The first and/or the second hydrophilic bonding surface are made of silicon having a native oxide.

The first and/or the second hydrophilic bonding surface are flat.

The first and second substrates are each independently selected from substrates having a diameter comprised between 2 and 12 inches, in particular between 200 mm and 300 mm.

One or more first vignettes and/or one or more second vignettes have a lateral dimension or a diameter comprised between 100 micrometers and 5 mm, for example the first and/or second vignette has a generally square main surface whose lateral dimensions are 100 micrometers×100 micrometers.

The first and/or the second substrate each comprises at least one electronic component, such as a chip, covered by a hydrophilic film before step b) of depositing the basic solution.

The first and the second substrate are each independently selected from a solid substrate (bulk) or a composite substrate (several layers of material).

The first substrate and the second substrate can be of identical nature or of different nature.

Other aspects, objects and advantages of the present invention will appear better on reading the following description of two embodiments thereof, given by way of non-limiting example and made with reference to the appended drawings. In the remainder of the description, for the sake of simplification, identical, similar or equivalent elements of the different embodiments bear the same reference numerals. The figures do not necessarily respect the scale of all the elements represented so as to improve their readability.

FIG. 1 represents a schematic view of a deposition of a basic solution on a hydrophilic surface of a first substrate and the drying according to a step b) and a step c) of the method according to one embodiment of the invention.

FIG. 2 represents a schematic view of a direct bonding of a first substrate and a second substrate forming an assembly according to a step d) of the method according to the embodiment of FIG. 1.

FIG. 3 represents a schematic view of a heat treatment applied to an assembly of the first substrate and of the second substrate according to a step e) of the method according to the embodiment of FIG. 1.

FIG. 4 represents a graph illustrating comparative examples of bonding energy obtained according to the embodiment of FIG. 1 and a control example.

FIG. 5 represents a schematic view of a direct bonding of first vignettes on a second substrate according to an alternative embodiment of the invention.

As illustrated in FIGS. 1 to 3, the method according to the invention comprises the supplying of a first and a second substrate 1, 2 to the hydrophilic bonding surfaces 3, 4 (step a), the depositing of a basic solution B on the surfaces 3, 4 (step b) and its drying (step c), direct contacting for spontaneous direct bonding by creating a direct bonding interface 6 (step d) and possible bonding annealing (step e) of the assembly 7 thus formed. In particular the first and the second substrate 1, 2 are wafers of silicon having a thickness of 725 micrometers and a diameter of 200 mm. They each have a bonding surface 3, 4 formed by a hydrophilic film 5 of thermal silicon oxide with a thickness of approximately 145 nm. These bonding surfaces 3, 4 are cleaned by a Caro treatment and a SC1 treatment allowing the removal of organic and particulate contaminants, resulting in hydrophilic surfaces 3, 4 ready for bonding.

A basic solution comprising strong base molecules in deionized water is then deposited by spin coating on the hydrophilic bonding surface 3 of the first substrate 1 with a rotation speed of 400 rpm according to step b) of the method (FIG. 1). Beforehand, a strong base consisting of NaOH was dissolved in deionized water so as to obtain said basic solution with a concentration of approximately $10^{-5}$ g·cm$^{-3}$ in NaOH. According to a variant not visible in the figures, the strong base is selected from LiOH, KOH, RbOH, CsOH, Mg(OH)$_2$, Ca(OH)$_2$, Sr(OH)$_2$, Ba(OH)$_2$ and a mixture of these bases.

According to step c) of the method, the hydrophilic bonding surface 3 is dried by centrifugation until a hydrophilic surface 3 comprising between 1 and 5 atomic monolayers of water and a concentration of strong base molecules of approximately 13 at/cm$^2$. The drying centrifugation is carried out at a speed of about 2000 revolutions/min for about 45 sec.

The second substrate 2 is subjected to the same steps b) and c) (not illustrated) as the first substrate 1 before they are brought into contact to create a direct bonding interface 6, by spontaneous direct bonding of their hydrophilic bonding surfaces 3, 4. The propagation of the bonding wave to cross the 200 mm of the substrates 1, 2 is about 9 sec. This is similar to the propagation time of the bonding wave without the presence of strong base molecules at the interface 6. It is deduced from this that the adhesion energy of the two hydrophilic bonding surfaces 3, 4 does not have been modified by steps b) and c) of the method. The bonding energy of the assembly 7 obtained at the end of step d) is greater than 140 mJ/m$^2$, bonding energy value obtained in the absence of strong base molecules at the bonding interface 6, the bonding energy is in particular about 200 mJ/m$^2$ according to this embodiment of the invention.

According to a variant not illustrated, steps b) and c) are performed only on one of the first and second substrates 1, 2. According to another variant, the first hydrophilic surface

3 and the second hydrophilic surface 4 are not formed by a film of silicon oxide 5 but by the hydrophilic silicon (i.e the native oxide on the surface of the silicon) of the substrates 1, 2.

According to a possibility illustrated in FIG. 3, a bonding annealing heat treatment according to step e) is applied at atmospheric pressure to the assembly 7. The results are represented by the dotted line curve in FIG. 4 illustrating the bonding energy on the ordinate axis and the annealing temperature in degrees Celsius on the abscissa axis. The bonding energy is measured for example with the double lever method with imposed displacement in an anhydrous atmosphere as described in the article by F. Fournel, L. Continni, C. Morales, J. Da Fonseca, H. Moriceau, F. Rieutord, A. Barthelemy, and I. Radu, Journal of Applied Physics 111, 104907 (2012). The temperature is applied to the assembly 7 for 2 hours then the measurement is carried out on the assembly 7 after returning to ambient temperature. Control examples were carried out in parallel on direct bonding identical to those of the invention but in the absence of strong base molecules on the bonding surfaces (solid line curve). As illustrated in FIG. 4, temperatures of 100° C., 200° C., 300° C. and 500° C. have been evaluated for direct bonding assisted by basic molecules and the bonding energy is significantly higher than that of direct unassisted bonding from 100° C. The gap widens particularly after bonding annealing at 200° C., for which assisted direct bonding according to the invention reaches 4.5 J/m² while unassisted bonding has a bonding energy of less than 0.5 J/m².

The measurement of the bonding energy could not be carried out after the annealing at 300° C. and at 500° C. because the application of the measurement method requiring the separation of the substrates led to the breakage of the silicon substrates (illustrated by crosses on the graph of FIG. 4). Thus, the direct bonding energy is greater than the silicon fracture energy of 5 J/m². It therefore exceeds this value from 300° C. Unassisted direct bonding reaches only 2.2 J/m² after bonding annealing at 500° C.

According to another variant illustrated in FIG. 5, the first substrate 1 provided in step a) is vignetted in several first vignettes 8 whose exposed faces are first hydrophilic bonding surfaces 3. The first vignettes 8 are bonded according to the method previously described on the second full wafer substrate 2 according to a chip to wafer bonding. According to yet another variant not illustrated, the second substrate 2 is also vignetted in several second vignettes and the method of the invention allows the direct bonding of the first vignettes 8 and of the second vignettes.

According to an alternative not illustrated, the first hydrophilic bonding surface 3 and the second hydrophilic bonding surface 4 are formed at least in part by a hydrophilic film 5 of copper oxide. Concretely, first and second 1, 2 silicon substrates of 300 mm in diameter and 775 micrometers thick are prepared so as to have hybrid copper-oxide surfaces bondable in direct bonding. These first and second hydrophilic bonding surfaces 3, 4 are typically composed of copper pads with sides of 2.5 micrometers separated by 2.5 micrometers of SiO₂. It is then a hybrid surface with a «pitch» of 5 micrometers. Just after the mechanical-chemical polishing which makes it possible to make these bonding surfaces 3, 4 perfectly flat and bondable, and just before bonding, a solution of NaOH at 10⁻⁵ g/cm 3 is deposited in deionized water by spin coating according to step b). After this spin coating, the two hydrophilic surfaces 3, 4 are then dried by centrifugation at 2000 revolutions/min for 45 s according to step c). Then the two surfaces 3, 4 are brought into contact. The bonding wave then takes about 12 s to cross the 300 mm, which is equivalent to bonding without this basic molecule. The assembly 7 is annealed at 400° C. for 2 hours. No particular defect is observed by acoustic microscopy.

Thus, the solution put in place by the present invention makes it possible to significantly increase the direct bonding energy, even with substrates of large diameters, with or without heat treatment carried out at low temperature, so that it is applicable to substrates with temperature sensitive components. The method is simple to implement and the steps of depositing the basic solution and drying the surfaces are rapid. The basic solutions used are inexpensive, the quantities of base are very low, which does not modify the adhesion energy of the substrates 1, 2 and allows spontaneous direct bonding.

The invention claimed is:

1. A direct bonding method between two substrates, the method comprising the steps of:
   a) providing a first substrate and a second substrate respectively comprising a first hydrophilic bonding surface and/or a second hydrophilic bonding surface,
   b) depositing on the first and/or on the second hydrophilic bonding surface a basic solution consisting of strong base molecules and deionized water,
   c) drying the first and/or the second hydrophilic bonding surface so as to reach a concentration comprised between approximately 10⁹ atoms/cm² and 10¹⁵ atoms/cm² of cations resulting from the strong base molecules on the first and/or on the second hydrophilic bonding surface,
   d) bringing the first and the second hydrophilic bonding surface into contact so as to obtain a spontaneous direct bonding and an assembly of the first substrate with the second substrate comprising a direct bonding interface.

2. The direct bonding method according to claim 1, wherein the drying step c) is carried out so that the first hydrophilic bonding surface and the second hydrophilic bonding surface are covered with one to five atomic monolayers of H₂O.

3. The direct bonding method according to claim 1, wherein the strong base molecules are selected from the bases LiOH, NaOH, KOH, RbOH, CsOH, Mg(OH)₂, Ca(OH)₂, Sr(OH)₂, Ba(OH)₂ and a mixture of these bases.

4. The direct bonding method according to claim 1, wherein the basic solution has a concentration of strong base molecules comprised between 10⁻⁸ mol/l and 10⁻² mol/l in the deionized water.

5. The direct bonding method according to claim 1, wherein step c) is carried out by centrifugation, for example with a rotational speed of approximately 2000 revolutions/min of the first and/or the second hydrophilic bonding surface.

6. The direct bonding method according to claim 1, comprising a step e) of applying a heat treatment to the assembly obtained in step d) at a temperature comprised between 50° C. and 500° C.

7. The direct bonding method according to claim 1, wherein the first and second substrates are made of silicon.

8. The direct bonding method according to claim 1, wherein the first hydrophilic bonding surface and/or the second hydrophilic bonding surface are formed at least in part by a hydrophilic film in a material selected from silicon oxide, silicon nitride, copper oxide and a mixture of these materials.

9. The direct bonding method according to claim 1, wherein the first substrate provided in step a) comprises one or more first vignettes originating from the vignetting of the first substrate so to obtain a direct bonding of one or more first vignettes to the second substrate.

10. An assembly comprising a first substrate and a second substrate made of silicon respectively comprising a first hydrophilic bonding surface and a second hydrophilic bonding surface, the first and the second surface hydrophilic bonding surface being bonded by direct bonding, strong base molecules being arranged with a concentration comprised between approximately $10^9$ atoms/cm$^2$ and $10^{15}$ atoms/cm$^2$, at the direct bonding interface between the first and the second hydrophilic bonding surface.

* * * * *